US008005233B2

(12) United States Patent
Smith

(10) Patent No.: US 8,005,233 B2
(45) Date of Patent: Aug. 23, 2011

(54) BASS ENHANCEMENT FOR AUDIO

(75) Inventor: William Paul Smith, Bangor (IE)

(73) Assignee: DTS, Inc., Calabasas, CA (US)

( * ) Notice: Subject to any disclaimer, the term of this patent is extended or adjusted under 35 U.S.C. 154(b) by 924 days.

(21) Appl. No.: 12/001,184

(22) Filed: Dec. 10, 2007

(65) Prior Publication Data

US 2009/0147963 A1 Jun. 11, 2009

(51) Int. Cl.

| | |
|---|---|
| ***H03G 3/00*** | (2006.01) |
| ***H03G 5/00*** | (2006.01) |
| ***H04R 1/40*** | (2006.01) |

(52) U.S. Cl. ............................... 381/61; 381/98; 381/97

(58) Field of Classification Search .................... 381/61, 381/98, 97; 700/94

See application file for complete search history.

(56) References Cited

U.S. PATENT DOCUMENTS

| | | | | |
|---|---|---|---|---|
| 4,150,253 | A | 4/1979 | Knoppel | |
| 4,984,273 | A | 1/1991 | Aylward et al. | |
| 5,243,658 | A | 9/1993 | Sakata | |
| 5,744,992 | A | 4/1998 | Baumann | |
| 6,134,330 | A | 10/2000 | De Poortere et al. | |
| 6,285,767 | B1 | 9/2001 | Klayman | |
| 6,792,119 | B1 | 9/2004 | Aarts | |
| 6,865,430 | B1 * | 3/2005 | Runton et al. | 700/94 |
| 7,031,474 | B1 | 4/2006 | Yuen | |
| 2008/0103763 | A1 * | 5/2008 | Shimura et al. | 704/200.1 |

* cited by examiner

*Primary Examiner* — Ping Lee

(74) *Attorney, Agent, or Firm* — William L. Johnson; Gaurav K. Mohindra; James E. Mrose

(57) ABSTRACT

A method and apparatus for conditioning an audio input signal to enhance perception and reproduction of bass frequencies. Harmonics are generated and combined with a phase-shifted version of the audio input signal. Use of a controlled phase shift reduces or eliminates unwanted introduction of waveform asymmetry or D.C. offset.

21 Claims, 3 Drawing Sheets

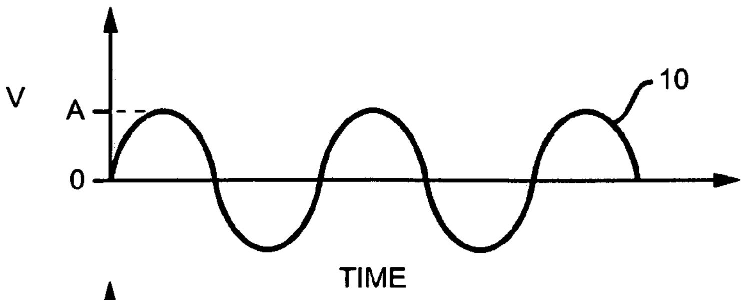
FIG. 1a
PRIOR ART
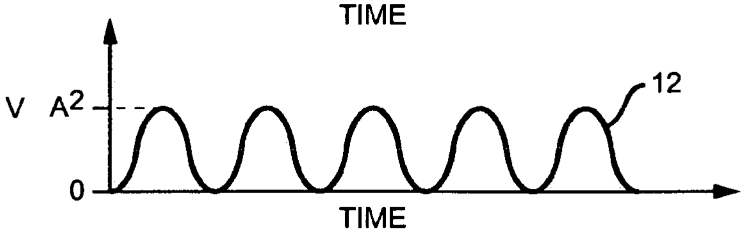
FIG. 1b
PRIOR ART
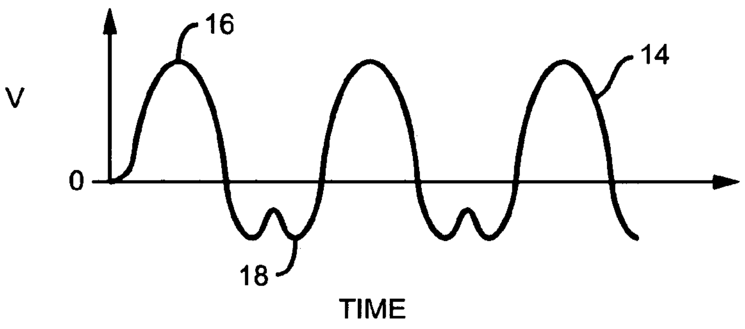
FIG. 1c
PRIOR ART
FIG. 2
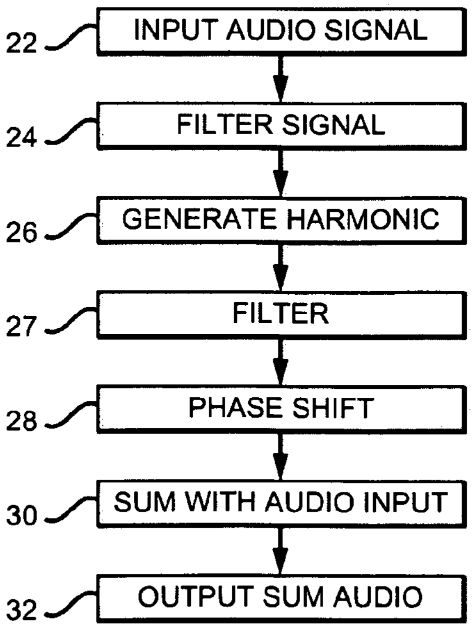

BASS ENHANCEMENT FOR AUDIO

BACKGROUND OF THE INVENTION

1. Field of the Invention

This invention relates to high-fidelity audio reproduction and more specifically to a method of enhancing low-frequency audio signals for better reproduction on small speakers.

2. Description of the Related Art

High-fidelity sound reproduction typically relies upon speakers capable of translating electrical impulses into sound waves that more or less accurately represent an original sound. Bass frequencies (for example, frequencies lower than 100 Hz) represent a particular challenge for the speaker design. To produce sounds at such bass frequencies, speaker designers have traditionally relied upon large and heavy designs ("woofers") which are relatively expensive to produce. Woofers present both electrical and mechanical challenges for the manufacturer; they pose no less a problem for many consumers desirous of a more portable audio listening experience. In particular, headphones and portable "ear-bud" speakers have difficulties in reproducing bass frequencies without distortion and without loss in volume, sometimes severe.

Because of the difficulties reproducing bass frequencies, some audio reproduction systems have employed various means to enhance the bass response, or at least to improve the psychoacoustic perception of bass tones. In some schemes, psychoacoustic phenomena have been exploited to enhance a listener's subjective impression of bass tones. For example, U.S. Pat. No. 6,134,330 describes a known technique of enhancing the subjective experience of tones in the 40 to 100 Hz range by exploiting the phenomenon known as "virtual pitch" or "missing fundamental." This phenomenon refers to the empirically verified fact that the presence of a series of harmonics can create the illusion of a fundamental tone at a lower frequency, where the harmonic or harmonics are at integer multiples of the (implied) fundamental frequency. This phenomenon is believed to be exploited by the cello, which is otherwise dimensionally too small to resonate in the lower range of the instrument. By adding harmonics, which are more easily reproducible with smaller transducers, one can create the impression of a bass fundamental that would be difficult to reproduce without large speakers.

As described in U.S. Pat. No. 6,134,330, it is known to filter an audio signal to select a bass subband, to generate harmonics of tones present in the bass subband, and the thereafter add said generated harmonics to the audio signal. The presence of the generated harmonics improves the perception of the low frequency portion of the audio. The generated harmonics are higher in frequency than the fundamental, and thus can be more efficiently reproduced with relatively small speakers.

SUMMARY OF THE INVENTION

In view of the above problems, the present invention includes a method of conditioning an audio signal to enhance perception of bass response. The method includes the steps: filtering said audio signal to produce a selected subband signal having at least one fundamental component with a fundamental frequency in a first frequency range; generating at least one harmonically-enriched signal from said selected subband signal, said harmonically enriched signal including at least one harmonic component at an integer multiple of said fundamental frequency; introducing a phase shift between said audio signal and said harmonically enriched signal to produce a phase-shifted audio signal; adding said phase-shifted audio signal to said harmonically enriched signal to produce a conditioned audio signal.

The invention in an apparatus aspect includes a signal conditioning circuit for conditioning an audio input signal to enhance perception of bass frequencies. The circuit includes: a filter, coupled to receive said audio input signal and arranged to select and to output a frequency subband signal having at least one fundamental tone; a harmonic generator, arranged to receive said frequency subband signal and generate a harmonic signal having at least one harmonic component; a phase shifter, coupled to receive said audio input signal and arranged to introduce a phase shift, thereby producing a phase-shifted audio signal; and a summing circuit, coupled to receive said phase shifted audio signal and said harmonic signal and to sum said signals to produce a conditioned audio signal having enhanced harmonics of selected frequencies.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 1*a* is a graph of voltage as a function of time (on the horizontal axis) for an audio waveform in a prior art method of bass enhancement;

FIG. 1*b* is a graph of a harmonic-rich waveform generated from the waveform of FIG. 1*a*, by a prior art method;

FIG. 1*c* is a graph showing the result of addition of the waveforms of FIGS. 1*a* and 1*b* by a prior art method;

FIG. 2 is a flow diagram showing steps of a method in accordance with the invention;

DETAILED DESCRIPTION OF THE INVENTION

Figure 3A:
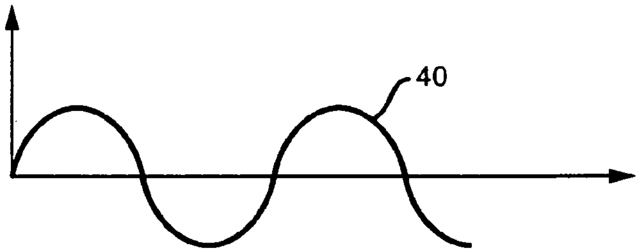
FIG. 3*a* is a graph of voltage as a function of time (on the horizontal axis) for an audio waveform input into the method of the invention.

The invention concerns processing of audio signals, either in digital or analog form. In the discussion which follows, analog waveforms are often shown to illustrate the concepts; however, it should be understood that typical embodiments of the invention will operate in the context of a time series of digital bytes or words, said bytes or words forming a discrete approximation of an analog signal. The discrete, digital signal corresponds to a digital represention of a periodically sampled audio waveform. As is known in the art, the waveform must be sampled at a rate at least sufficient to satisfy the Nyquist sampling theorem for the frequencies of interest. The quantization scheme and bit resolution should be chosen to satisfy the requirements of a particular application, according to principles well known in the art. The techniques and apparatus of the invention could be, and typically would be applied independently in a number of channels, for example in a two channel "stereo" system or in a "surround" audio system having more than two channels. Although a digital realization of the invention is the primary focus of the disclosure, the invention is not limited to a digital embodiment and could be realized in analog circuitry.

FIGS. 1*a*, 1*b*, and 1*c* show exemplary (continuous) waveforms as might be expected in a prior art method of bass enhancement by harmonic generation. FIG. 1*a* shows a fundamental sinusoidal bass tone 10. FIG. 1*b* shows a harmonic-rich waveform 12 obtained by squaring the waveform of FIG. 1*a*. As is known from trigonometry, the squared waveform 12 includes frequency components at 21, where f is the frequency of the fundamental 10. FIG. 1*c* shows at 14 the sum of waveforms 10 and 12. This waveform would be produced by prior art methods of bass enhancement by harmonic generation.

The waveform 14 does include added harmonic content (in this case even harmonic at frequency 2*f*). However, it is also apparent from the peak levels 16 (positive) and 18 (negative) that the waveform 14 has had a peak offset introduced, and is no longer symmetrical about the zero level 20. Specifically, in the example, for normalized waveform with amplitude A, the waveform 14 has been shifted by a unwanted d.c. bias so that the positive peak 16 reaches a much higher absolute value than the negative peak at 18.

The introduction of bias or offset in waveform 14 has undesirable consequences in that more dynamic range or "headroom" must be preserved to prevent saturation, a situation in which the wave exceeds the maximum value that can be represented in the given quantization range. For a given bit allocation, the offset will effectively reduce the usable range of values before saturation, effectively making the bit allocation less efficient. Scaling down the waveform would avoid saturation but increase quantization noise. The problem is particularly troublesome because the offset is not constant with amplitude, but instead varies with the root-mean-square (rms) value of the waveform. In the case of musical audio content, the rms value changes quickly and over a very large, unpredictable range. This makes it difficult to zero the waveform by simple subtraction of an offset. Frequent calculation of rms values would require a large number of calculations, requiring processing power and time. In many audio applications processing power and time are limited by the specification and cost considerations.

The present invention provides a simple method to reduce or eliminate the offset introduced by harmonic generation. The method of the invention consumes few processor cycles, involves little computation and memory, introduces little delay and requires relatively small amounts of memory.

FIG. 2 shows in procedural terms a generalized method in accordance with the invention. An audio signal is input in step 22, suitably represented in time domain. For example, a linear PCM representation could be used. The input audio is split and follows parallel paths through two branches of the algorithm. In a first branch, the input audio is filtered (step 24) either by a low pass or bandpass filter, to select a bass frequency range which is to be enhanced. Suitably, the filtering step may extract a range of frequencies, for example from 0 to 200 Hz, for enhancement by harmonic generation. In another embodiment, the frequency range from 0 to 120 Hz is selected. The upper cutoff frequency will depend upon the anticipated limitations of the bass reproduction in the assumed speaker system that is to be employed. Multi-tap digital filters such as a finite-impulse-response (FIR) filter could be used. Alternatively, the input audio could be presented in a frequency domain representation; which can be filtered by appropriate windowing in the frequency domain. The resulting frequency representation can thereafter be converted to time domain by an inverse transformation (such as an inverse FFT).

Next, in step 26 the selected frequency range is processed by a method to generate harmonics. Any of several methods could be used. The waveform may be multiplied by itself (each sample squared) to generate "even" harmonics (at frequencies corresponding to the fundamental frequency multiplied by even integers). This method generates a strong harmonic at frequency 2*f*, where f is the frequency of the selected fundamental tone. Higher ordered harmonics can be generated by cubing the signal or taking the waveform to higher (odd) powers to generate "odd" harmonics (at odd multiples of the fundamental frequency). Alternatively, the signal can be multiplied by a strongly non-linear function (such as an exponential function, analogous to a semiconductor diode junction). By whatever method, harmonics are generated to produce a harmonically enriched signal.

In step 27 the harmonically-enriched signal is filtered with a high pass or bandpass filter to attenuate the fundamental and remove D.C. components (if any, added during harmonic generation). Strong low-frequency fundamentals and D.C. components are found in some embodiments to interfere with faithful operation of a speaker system, particularly with low-cost, small speakers which are unable to cope with wide, low frequency excursions.

Removal of D.C. components from even-numbered harmonics in step 27 is optional but desirable to reduce offset. Nevertheless, the removal of D.C. offset in step 27 (or 26) is not sufficient-without the other steps of the invention-to completely remove unwanted offset. This is because further offset is (in conventional methods) introduced in later mixing or summation steps. Furthermore, the offset introduced in said mixing steps is highly variable, depending on signal content. This makes removal by conventional means difficult.

In a parallel signal path, the original input audio is shifted in phase (phase shift, step 28) preferably by an angle greater than zero degrees and less than 180 degrees (lead or lag). If we assume a strong tone at a fundamental frequency f0, our references to phase are measured in relation to the fundamental waveform (see FIG. 3*a*). It is found sufficient to choose an assumed fundamental frequency approximately at a centroid frequency in the bass region (for example, at 60 Hz for a Bass range defined from 0 to 120 Hz). It has been found most preferable to set the phase shift in this step 28 to approximately 90 degrees of phase. As explained below in connection with FIGS. 3*a*-3*c*, this phase shift is most useful in decreasing or eliminating the offset introduced into the bass-enhanced waveform.

After phase shifting, it is optionally desirable to filter the shifted signal with a high pass filter to attenuate fundamental components below a cutoff frequency which defines the limitations of the intended bass transducers. As previously described, the presence of strong low-frequency signals or D.C. bias may interfere with the performance of low-cost, small speakers or audio transducers. Inclusion of high-pass filters in at least one of steps prevents the undue amplification of the fundamentals, which might otherwise occur.

Finally, the phase-shifted harmonic signal is added back to the original input audio signal (step 30). (Optionally, the phase-shifted harmonic signal might be scaled before adding it to the input audio signal, for greater control of the bass enhancement.) The sum of the input audio with the phase-shifted harmonics is output (step 32), either to the speaker or for further processing before eventual reproduction.

Figure 3B:
FIG. 3*b* is a graph of a harmonic-rich waveform generated from the waveform of FIG. 3*a* and phase shifted in accordance with the invention.
Figure 3C:
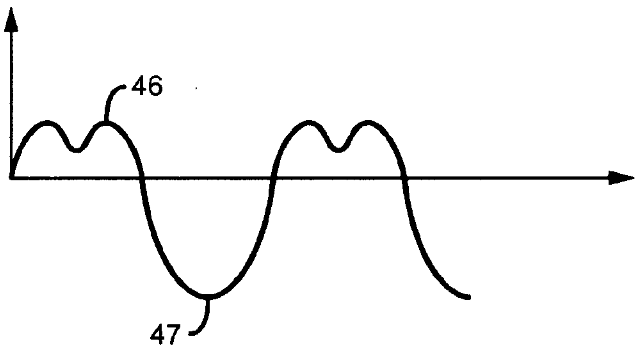
FIG. 3*c* shows a waveform obtained by summing the waveforms of FIGS. 3*a* and 3*b* in accordance with the invention.

FIGS. 3*a*, 3*b*, and 3*c* demonstrate the effect of the method of the invention on an exemplary sinusoidal waveform. One can compare these figures with the analogous FIGS. 1*a*-1*c* to see the effects of phase shifting the harmonics before summing with the input audio. FIG. 3*a* shows the input audio waveform at 40. FIG. 3*b* shows a waveform 42 derived by squaring (self-multiplication) the input audio 40, filtering to remove fundamental, then phase shifting. Note that the waveform 42 differs in phase from the counterpart waveform 12 in FIG. 1*b*. FIG. 3*c* shows at 44 the sum of waveforms 40 and 42. The peak positive excursion 46 of waveform 44 is noticeably lower than the peak positive excursion of the corresponding waveform 14 in FIG. 1*a*. This helps prevent the digital value from exceeding the maximum value permitted within the digital representation scheme (linear pcm, for example). Peak negative excursion at 47 is almost the same absolute value as the positive excursion; compared to the prior art method of FIGS. 1*a* to 1*c*, bias or offset has been reduced or eliminated.

The invention may also include injection of odd harmonics (in step 26). Odd harmonics are less troublesome than even harmonics. The cubing of a waveform, for example, produces a wave generally symmetrical about zero, and thus does not tend to introduce offset. However, the phase shift introduced in step 28 above can also be applied to the odd harmonics without reducing the effectiveness. In addition, higher ordered even harmonics may be generated in step 26. For example, fourth-order harmonics may be generated by raising the signal to the fourth power, and so forth.

It should be understood that the phase shift in step 28 is a relative shift, which introduces either lead or lag between the signal in the second branch and that in the first branch. In a simple variant of the invention, the signal in the opposite branch could undergo phase shifting, to produce essentially the same result. Accordingly, the method of the invention includes introducing a relative phase difference between a signal in a first branch and another signal in a second branch.

Figure 4:
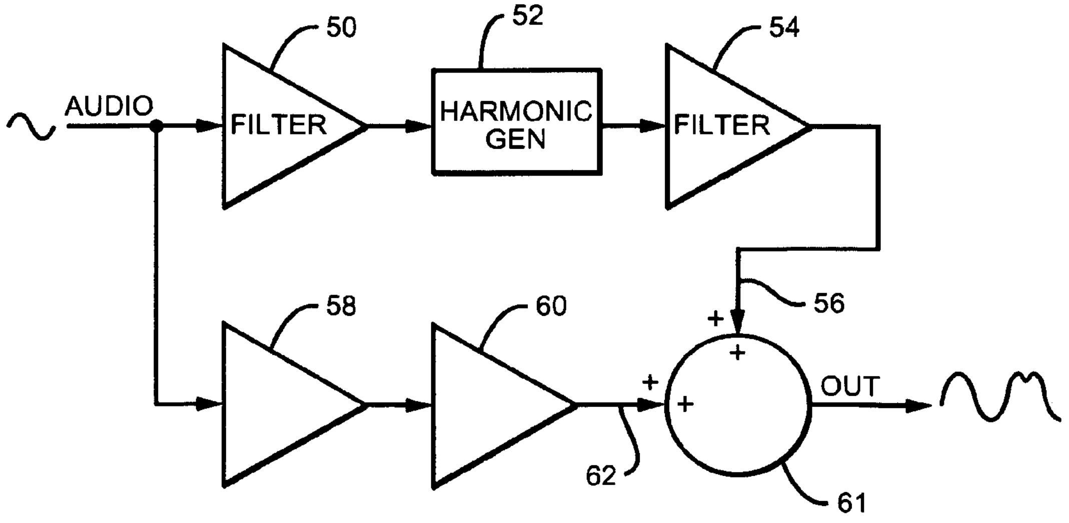
FIG. 4 is a schematic of an apparatus in accordance with the invention, with functional modules represented as blocks ("block diagram")

FIG. 4 shows in schematic form one embodiment of an apparatus in accordance with the invention. An audio signal is input to a first filter 50 which selects the bass region for enhancement. Suitably, the 20 to 120 Hz frequency range is selected (frequencies below 20 Hz are generally assumed absent). In a digital embodiment, the filtering may be performed by a specialized or programmable DSP integrated circuit, or by a programmable microprocessor and associated memory. The output of the first filter 50 is input to a harmonic generator 52, which could be a programmable general or special purpose digital signal processing circuit. Harmonics may be generated numerically by the methods mentioned above, or by other known methods. The output of the harmonic generator 52 is then filtered by a second (high pass) filter 54 to attenuate the fundamental and remove any D.C. bias or offset. The result serves as a first input 56 into a summing circuit 61.

The original input signal also passes through a phase shift circuit in a parallel branch or signal path. The phase shifting circuit suitably can be realized by a general purpose programmable microprocessor or a specialized dsp processor of the type used to implement an FIR digital filter. For example, the DSP processor chip "ADSP-21367", available from Analog Devices, Inc. (ADI), could be programmed to introduce a suitable phase delay. In one embodiment a controlled phase is approximated by a simple delay of a predetermined number N of samples. For example, for a fundamental bass frequency of f0, the phase shift corresponding to a delay of tau=90 degrees is given by $$\text{delay}=(\text{sampling rate})/(4\times(\text{center frequency})) \quad \text{Eq. 1:}$$

where the delay is in seconds and frequency in Hz. This is easily generalized to calculate the delay for any arbitrary Tau.

$$\text{Tau}=2\pi*\text{delay}*\text{sampling rate} \quad \text{Eq. 2:}$$

(for tau in radians, delay in seconds, sampling rate in Hz).

In terms of number of samples in a discrete signal sampled at sampling rate (fs), a desired delay is approximated by the nearest integer number of samples N where N/fs equals Tau.

It can be seen that the number of samples required to introduced a desired phase delay depends on the assumed fundamental frequency of the bass fundamental tone f0. In a simple embodiment, the frequency can be approximated by an arbitrary frequency selected within the subband selected for enhancement, for example, the frequency situated mid-band in the subband. In one embodiment, the center frequency is assumed at 80 Hz.

In one specific embodiment, frequencies from 20 to 120 Hz are selected for enhancement. The phase delay can be approximated by introducing a delay given by the equations given above, with an assumed center frequency at 80 Hz.

In such embodiment, the delay is suitably set to 90 degrees (pi/4) at 80 Hz.

One extremely convenient method of introducing the delay is to store samples sequentially in a random access addressable memory. An memory offset number is then added or subtracted to the data address pointer, and the data retrieved is thereby delayed by a number of samples corresponding to the memory offset number. Alternatively, the audio signal data could be stored in a FIFO buffer or shift register with length corresponding to the desired delay.

After phase shifting, the phase-shifted signal is preferably filtered with a high pass filter 60 to attenuate fundamental and eliminate D.C. bias, then input into a second input 62 of the summation circuit 61. The second input 62 of the summation circuit 61 thus receives a phase shifted and filtered version of the original audio signal. The summation circuit sums the harmonic-enriched signal with the phase shifted input audio signal to produce an output signal enriched with harmonics of bass tones in the selected bass subband. The enriched output signal is more easily reproduced by small speakers (such as headphones) to give a convincing psychoacoustic illusion of enhanced bass response.

As with the previously described filters, harmonic generator and phase shifting circuit, the summation circuit could also be realized by a programmable microprocessor suitably programmed to sum audio samples from input audio with the phase-shifted harmonic signal. This processor could be the same or a different processor working in parallel.

The method of the present invention requires little calculation and is effective over a range of amplitudes to reduce offset which would otherwise be introduced (an unwanted artifact accompanying the even harmonics of the bass tone). It thus introduces very little delay and the reduction in offset allows the processor to take advantage of a full dynamic range without saturation or re-scaling the signal.

Figure 5:
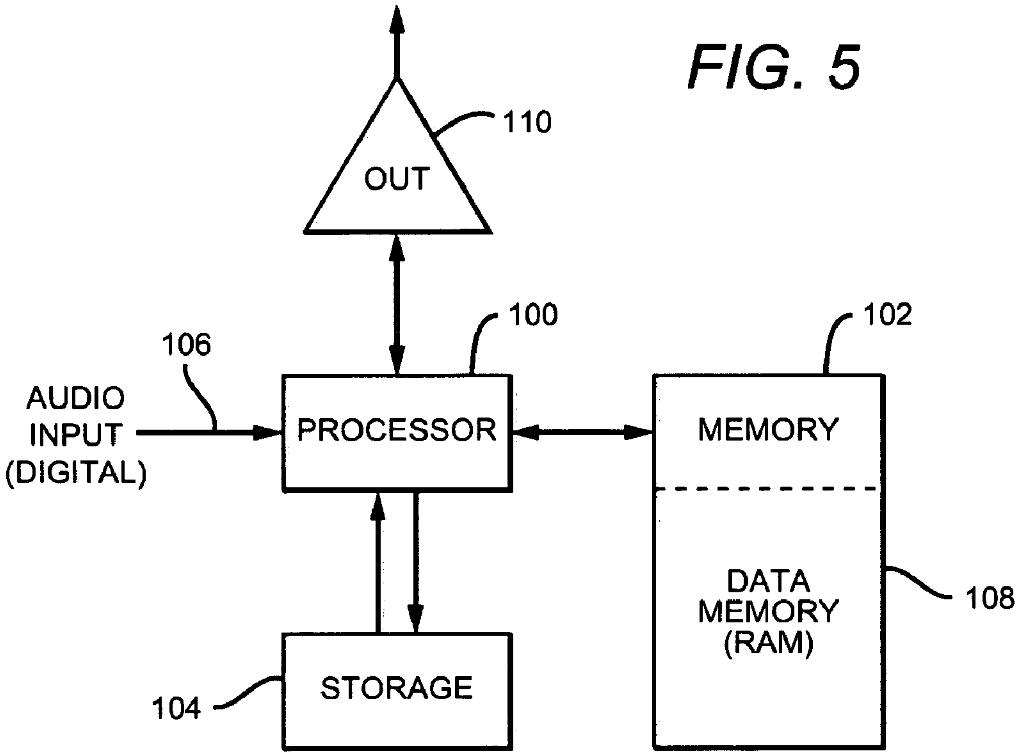
FIG. 5 is a block diagram of a signal processing system which can suitably be used to execute the method of the invention in an embodiment using a general or special purpose, programmable microprocessor.

FIG. 5 shows a block diagram of a signal processing system which can suitably be used to execute the method of the invention using a general or special purpose, programmable microprocessor. Microprocessor 100 communicates with program instructions stored in program memory 102, which may be permanently written (firmware) or may be loaded from a mass storage device 104. Appropriately buffered input audio samples are received at inputs 106. The microprocessor acts under program control to perform the functions as described above in connection with FIG. 2. Intermediate results and buffered data are written and read to/from data memory 108, which may be random access memory. Sufficient memory to store at least sufficient samples to accommodate the required delay, plus sufficient memory for any multi-tap digital filters is required. Those with skill in the art will easily determine the memory requirements, based on these aforementioned, requirements, together with the number of channels to be accommodated and the specific frequency parameters chosen for a particular embodiment. Output signal is output in the form of a series of discrete digitized samples at output port 110. Any suitable form of input and output interfaces may be employed, including SPDIF, HDMI, USB, "Firewire", IIS bus, and other electrical or optical data interfaces.

It will be apparent that variations of this architecture could be employed. For example: several processors can be used in parallel or series configurations: some performing filter functions while others perform phase shifting and harmonic generation. Dedicated DSP or digital filter chips can be employed as filters. Multiple channels of audio can be processed together, either by multiplexing signals or by running parallel processors.

In other embodiments of the invention, for example and not by way of limitation, other methods of phase shifting such as the "Hilbert transform" could be substitutes for pure delay. It should also be recognized that signal phase is a relative concept. For this reason, it is possible to create numerous similar or functionally equivalent variant methods of introducing the phase shift: For example, where the above describes introducing a phase shift in a first "signal" branch of the signal path, equivalent results can be obtained by introducing a contrary phase shift in the "harmonic enriched" path. Similarly, phase shifts could be introduced in both paths in combination, to yield an algebraic sum of phase shifts.

If simple time delay is used to provide phase shift in the invention, numerous method are known and could be employed. In a processor-powered embodiment, memory offset or shifts could be introduced by various means, including indirect addressing and by using an address offset vector. In other embodiments, various delay lines could be employed including first-in, first out (FIFO) buffers, shift registers, or even analog delay lines such as charge coupled devices (CCD) or other analog memory devices.

In another subsystem of the apparatus and method, other means could be used to generate harmonics. For example, the signal could be transformed into a frequency domain representation (suitably by a discrete cosine transform). Frequency peaks in the bass region could then be pitch-shifted upward to harmonic frequencies, and the resulting signal inverse-transformed back into a time-domain representation for further processing. This method may be advantageous in some applications, but will generally require more processor power and memory allocation.

While several illustrative embodiments of the invention have been shown and described, numerous other variations and alternate embodiments will occur to those skilled in the art. Such variations and alternate embodiments are contemplated, and can be made without departing from the spirit and scope of the invention as defined in the appended claims.

I claim:

1. A method of conditioning an audio signal to enhance perception of bass response, comprising the steps of:

filtering said audio signal to produce a selected bass subband signal having at least one fundamental component with a fundamental frequency in a bass frequency range;

generating at least one harmonically-enriched signal from said selected bass subband signal, said harmonically enriched signal including at least one harmonic component at an integer multiple of said fundamental frequency;

introducing a phase shift between said audio signal and said harmonically enriched signal;

adding said audio signal to said harmonically enriched signal, shifted in phase relative to each other, to produce a conditioned audio signal;

wherein the bass subband signal is within a range of frequencies from 0 to 200 Hz.

2. The method of claim 1, wherein said step of introducing a phase shift comprises:

introducing to at least one of a) said audio signal and b) said harmonically enriched signal a phase lead or lag relative to the other of said signals; said lead or lag in the range greater than 0 but less than 180 degrees.

3. The method of claim 2, wherein said step of introducing a phase shift comprises producing substantially a 90 degree phase shift at a nominal optimum frequency in the selected bass subband.

4. The method of claim 2, wherein said step of introducing a phase shift comprises introducing a controlled time delay.

5. The method of claim 4, wherein said controlled time delay is controlled to produce substantially a 90 degree phase shift at a nominal optimum frequency in the selected bass subband.

6. The method of claim 4, wherein said audio signal comprises a series of discrete, digitally represented samples;

said audio samples being stored in an addressable memory; and wherein said controlled time delay is introduced by using a memory offset vector.

7. The method of claim 4, wherein said controlled time delay is introduced by a first-in, first-out (FIFO) buffer.

8. The method of claim 2, wherein said phase shift is introduced by conditioning said filtered harmonic signal with a phase-shifting filter.

9. The method of claim 1, wherein said step of generating a harmonic signal comprises squaring said filtered signal, to produce an harmonic signal including at least a harmonic component at a frequency that is an even multiple of the fundamental frequency.

10. The method of claim 9, wherein said step of generating at least one harmonic signal further comprises generating at least one harmonic signal at a frequency that is an odd multiple of the fundamental frequency.

11. The method of claim 1 wherein the bass subband signal is within a range of frequencies from 0 to 120 Hz.

12. A signal conditioning circuit for conditioning an audio input signal to enhance perception of bass frequencies, comprising:

a filter, coupled to receive said audio input signal and arranged to select and to output a bass frequency subband signal having at least one fundamental tone;

a harmonic generator, arranged to receive said bass frequency subband signal and generate a harmonic signal having at least one harmonic component;

a phase shifter, arranged to introduce a phase shift between the audio input signal and the harmonic signal; and a summing circuit, coupled to receive said audio input signal and said harmonic signal, shifted in phase relative to each other by the phase shifter, and to sum said signals to produce a conditioned audio signal having enhanced harmonics of selected frequencies;

wherein the bass subband signal is within a range of frequencies from 0 to 200 Hz.

13. The circuit of claim 12, wherein said filter comprises a digital filter, and wherein said harmonic generator, said phase shifter, and said summing circuits comprise digital signal processing circuits.

14. The circuit of claim 13, wherein digital filter and said digital signal processing circuits comprise:

a programmable microprocessor;

addressable memory, coupled to store said audio signal, said memory coupled in communication with said programmable microprocessor and in communication with input and output circuits to input and output said input audio signal and conditioned audio signal;

a program module, stored in said addressable memory and executable on said programmable microprocessor to perform the functions of said digital filters, said phase shifter, said harmonic generator, and said summing circuits.

15. The circuit of claim 14, wherein said phase shifter introduces a phase lead or lag greater than 0 but less than or equal to 180 degrees.

16. The circuit of claim 15, wherein said phase shifter comprises a digital delay program module predetermined to introduce a desired phase shift in the selected frequency range.

17. The circuit of claim 16, wherein said phase shifter introduces said digital delay by modifying a memory address with a memory offset vector corresponding to the desired delay.

18. The circuit of claim 16, wherein said phase shifter comprises a phase-shifting digital filter.

19. The circuit of claim 12, wherein harmonic generator comprises a circuit that multiplies said filtered signal with itself, to produce a squared signal including even harmonics of said fundamental tone.

20. The circuit of claim 19, wherein harmonic generator further comprises a circuit that generates at least one harmonic of higher order than a harmonic at double the fundamental frequency.

21. The circuit of claim 12 wherein the bass frequency subband signal is within a range of frequencies from 0 to 120 Hz.

* * * * *